United States Patent [19]

Ohta et al.

[11] 4,091,171

[45] May 23, 1978

[54] OPTICAL INFORMATION STORAGE MATERIAL AND METHOD OF MAKING IT

[75] Inventors: Takeo Ohta, Nara; Mutsuo Takenaga, Katano; Nobuo Akahira, Neyagawa; Noboru Yamada, Moriguchi; Tadaoki Yamashita, Hirakata, all of Japan

[73] Assignee: Matsushita Electric Industrial Co., Ltd., Japan

[21] Appl. No.: 743,214

[22] Filed: Nov. 18, 1976

[30] Foreign Application Priority Data

Nov. 18, 1975 Japan ............................... 50-139033
Dec. 9, 1975 Japan ............................... 50-147224
Dec. 9, 1975 Japan ............................... 50-147225

[51] Int. Cl.$^2$ .................. B05D 1/34; G11B 11/12; G11B 23/00
[52] U.S. Cl. .................................. 428/539; 427/162; 427/164; 427/166; 427/248 A; 427/248 R; 428/913
[58] Field of Search ........... 427/162, 164, 166, 248 R, 427/248 A; 428/539, 913

[56] References Cited

U.S. PATENT DOCUMENTS

| 3,455,724 | 7/1969 | Tegg et al. | 427/248 R |
| 3,971,874 | 7/1976 | Ohta et al. | 427/162 X |

Primary Examiner—James R. Hoffman
Attorney, Agent, or Firm—Wenderoth, Lind & Ponack

[57] ABSTRACT

An optical information storage material having a substrate and a film deposited on the substrate, the state of said material can be changed from a low optical density state to a high optical density state by the application of electrical, optical or thermal energy. The major component of the film is $GeO_{x1}$, $SnO_{x1}$, $SbO_{x2}$, $TlO_{x2}$, $BiO_{x2}$ or $MoO_{x3}$ wherein $0 < x1 < 2.0$, $0 < x2 < 1.5$ and $0 < x3 < 3.0$. The film can be a mixture of above-mentioned material and an additive for improving the properties thereof. The material is made by vacuum evaporating $GeO_2$, $SnO_2$, $Sb_2O_3$, $Tl_2O_3$, $Bi_2O_3$ or $MoO_3$ under deoxidization conditions.

11 Claims, 9 Drawing Figures

OPTICAL INFORMATION STORAGE MATERIAL AND METHOD OF MAKING IT

BACKGROUND OF THE INVENTION

This invention relates to an optical information storage material, and more particularly pertains to the such material which can assume two or more physical states, each of which have different optical densities.

Amorphous materials have hitherto fallen into one of the above-mentioned categories. The state of these amorphous materials can be changed by applying electrical, optical, or thermal energy thereto. In one state such material has a so-called non-crystalline bulk structure which has partial order of the atoms and molecules when viewed microscopically but is seen to have a non-crystalline structure and low optical density. In the other state the material has a crystalline structure which has relatively high optical density. By utilizing such optical properties, i.e., the change of state from low optical density to high optical density or a reverse change thereof, the amorphous materials have been able to function as an optical information storage device when used in the form of a thin film.

Amorphous materials which have been utilized in an optical information storage device were multi-component materials such as (Te, Ge, Sb, S) or (Te, Ge, As, Ga).

The hitherto known materials described above are chalcogenide composites which easily form a two dimensionally bonded atomic configuration in a glassy state, or are composites which are obtained by adding elements which easily form a covalent tetrahedral atomic structure with the chalocogenide composites.

Those composites are superior in that both crystalline and non-crystalline states thereof are stable at room temperature.

With respect to optical sensitivity, however, those composites have insufficient sensitivity for the use in optical information storage.

Furthermore thin films consisting of those composites have a relatively high optical density in the non-crystalline state.

Therefore, when making record on a film with a thickness capable of giving a high contrast ratio (e.g. > 10 : 1), read-out-efficiency is relatively low i.e. < 10%.

SUMMARY OF THE INVENTION

It is an object of this invention to provide an optical information storage material which can assume two or more optical states and has an improved sensitivity relating to the change between the such states.

It is another object of this invention to provide an optical information storage material which exhibits a high contrast ratio.

It is a further object of this invention to provide an optical information storage material which has a low optical density when there is nothing recorded therein.

It is a further object of this invention to provide an optical information storage material which has a simple composition and is easy to make.

These objects are achieved by an optical information storage material according to the invention having a substrate and a film deposited on the substrate which film is composed of a sub-oxide material. The major component of the film is $GeO_{x1}$, $SnO_{x1}$, $SbO_{x2}$, $TlO_{x2}$, $BiO_{x2}$, or $MnO_{x3}$ in which $0 < x1 < 2.0$, $0 < x2 < 1.5$ and $0 < x3 < 3.0$.

The film can be a mixture of those said suboxides.

The film can include a further component as an additive as hereinafter described.

The film is made by vacuum evaporation which includes a deoxidizing process.

The starting material is e.g. $GeO_2$, $SnO_2$, $Sb_2O_3$, $Tl_2O_3$, $Bi_2O_3$ or $MoO_3$ when no additive is included and includes one of the elements used for deoxidization such as W, Cr, Mo, Fe etc.

DETAILED DESCRIPTION OF THE INVENTION

Figure 1:
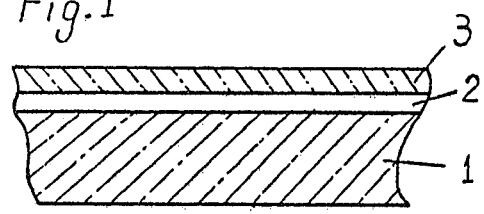
FIG. 1 is a cross-sectional view of an optical information storage material according to the present invention.

Referring to FIG. 1, the optical information storage material of the invention comprises a thin film 2 of suboxide deposited on a substrate 1 and preferably covered with a protective layer 3 of lacquer or the like.

The composition of deposited sub-oxide film is selected from the member of $GeO_{x1}$, $SnO_{x1}$, in which $0 < x1 < 2.0$ and $SbO_{x2}$, $TlO_{x2}$, $BiO_{x2}$ in which $0 < x2 < 1.5$ and $MnO_{x3}$ in which $0 < x3 < 3.0$.

Those sub-oxide films are obtained by vacuum evaporating at least one of $GeO_2$, $SnO_2$, $Sb_2O_3$, $Tl_2O_3$, $Bi_2O_3$ and $MoO_3$ under deoxidizing condition.

When those oxide starting materials are heated in a quartz or platinum crucible at the melting temperature or above, evaporation occurs, and the vapor of the starting material is generated.

Thus an oxide film is deposited on a substrate.

Those films are composed of $GeO_2$, $SnO_2$, $Sb_2O_3$, $Tl_2O_3$, $Bi_2O_3$, or $MoO_3$, corresponding to the starting materials.

Those oxide films, however, are not adaptive for optical recording materials because they are white or transparent films, and can't absorb light energy well, and do not have a changeable optical density.

To give such characteristic to the deposited film, a deoxidizing condition is necessary and the starting material should be changed to a sub-oxide.

As one of the method of obtaining the deoxidizing condition, it is desirable to heat a powder of the starting material with one of reaction elements such as W, Mo, Cr or Fe in a vacuum.

Figure 4:
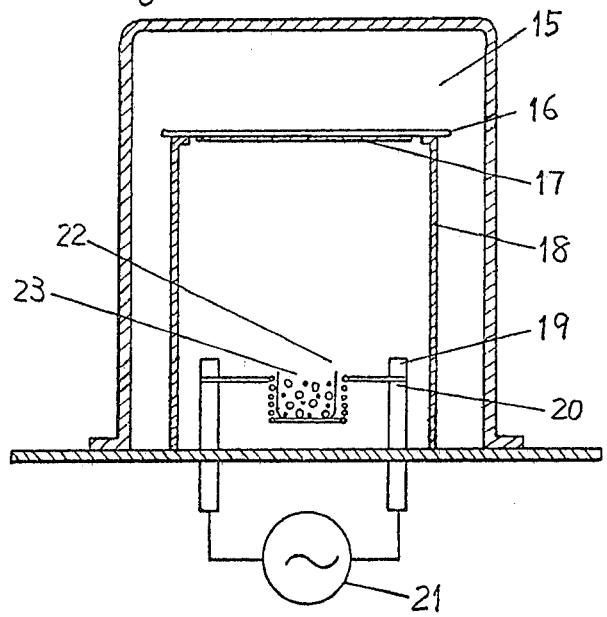
FIG. 4 is a side view of a vacuum evaporation apparatus including deoxidization condition for making an optical information storage material according to this invention.

The vacuum evaporation is performed by the apparatus shown in FIG. 4. A vacuum room 15 is maintained at required degree of vacuum, and a substrate 16 is placed therein, being supported by the stage 18. A starting material 23 is heated in a crucible 22. The crucible 22 is heated by a heater 20 which is connected to a power source 21 through terminals 19.

The deoxidizing condition is also obtained by performing vacuum evaporation with the use of an Mo or W crucible.

A vacuum of $10^{-3}$ mmHg to $10^{-6}$ mmHg is used, and even if the degree of vacuum is changed, the properties of the deposited layer do not show much difference.

Through such conditions, sub-oxide vapor is generated and deposits on the substrate, forming sub-oxide film.

As the substrate for the deposition of sub-oxide film, transparent polyester sheet, polytetrafluorethylene, glass, or paper is utilized.

The substrate can be in any shape depending on the purpose; for example, a sheet, a drum, a disc, etc.

The compositions of the deposited film obtained by such a process has a composition such as $GeO_{x1}$, $SnO_{x1}$ where $0 < x1 < 2.0$, $SbO_{x2}$, $TlO_{x2}$, $BiO_{x2}$ where $0 < x2 < 1.5$, and $MoO_{x3}$ where $0 < x3 < 3.0$.

This composition is different from the oxide starting-material, $GeO_2$, $SnO_2$, $Sb_2O_3$, $Tl_2O_3$, $Bi_2O_3$ or $MoO_3$, because of the reduction produced by the reaction element under vacuum evaporation.

The film of such composition is mostly pale brown except for $MoO_{x3}$, and its light transmissivity increases with lengthening of the wave length, in the range of 3500 A to 1$\mu$, except for the $MoO_{x3}$ film.

$MoO_{x3}$ film is pale blue and light transmissivity shows minimum in the range of 6000 A to 9000 A.

A film thickness of 300 – 8000 A is suitable.

Optical recording on said film is carried out by Xe flash, infrared lamp, laser or contact heating with a heater, etc.

The sensitivity for optical recording is affected by the thermal property of the base material. For example, the thinner the base, the greater the sensitivity. It seems to be caused by the fact that the temperature rises easily because of the low heat capacity thereof.

Moreover, with regard to the exposure to light, in the case of the Xe flash, recording efficiency is increased on shortening the duration of the flash because the heat-diffusion-loss within the substrate decreases.

The optical information storage material described above can be used in an audio or video recording apparatus, data memory, or like apparatus.

Figure 2:
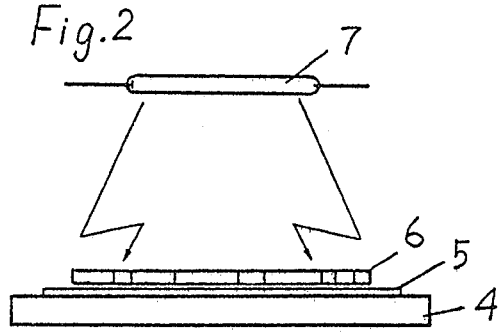
FIG. 2 is a cross-sectional view illustrating a method of copying a recorded information on an optical information storage material according to the present invention.
Figure 3:
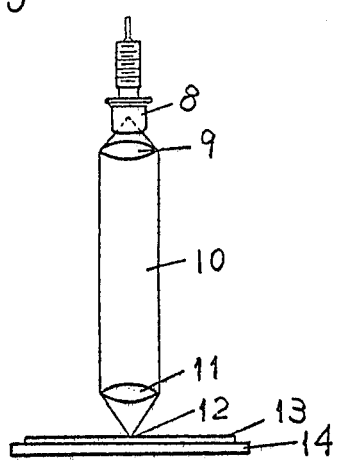
FIG. 3 is a side view illustrating a method for successively writing an optical information on an optical information storage material according to this invention.

The examples of optical recording apparatus for those optical information storage materials composed of sub-oxide film are illustrated in FIG. 2 and 3.

In FIG. 2, Xe flash lamp 7 is used, and sub-oxide optical recording film 5 is deposited on the substrate 4. A mask 6 having some optical pattern contacts the film 5, upon which the Xe flash lamp 7 radiates flash exposure, and thus a pattern caused by the mask 6 is formed on the film.

In FIG. 3, laser diode 8 is used, for example a Gallium-Arsenide injection laser, which emits radiation of the wave length 9040 A. The radiant flux generally has a large beam spread, therefore at least two lenses 9 and 11 are used for forming a micro spot. The first lens 9 transforms the spread beam to pseudo-parallel beam 10 and the second lens 11 can transform the beam to a converged microspot 12. The spot beams are applied to the sub-oxide film 13 deposited on the substrate 14. In this case, successive recording of information can be performed easily by modulating the laser beam.

Retrieving of an optical information recorded on the above-mentioned material is made by detecting the change of the amount of light transmission therethrough. As the case may be, the information can be retrieved by detecting the change of the amount of light reflected by the storage material.

The following examples illustrate preferred embodiments of this invention.

EXAMPLE I $GeO_2$ powder is used as a starting material. When vacuum evaporation method is applied, one of the starting material compositions is represented by the following formula:

$$\{(GeO_2)_{100-y1}(M_1)_{y1}\}_{100-z1}R_{z1}$$

$M_1$; additive material
R; deoxidizing reaction element
where $y1$ and $z1$ represent mole % and $0 < y1 < 100$, $0 < z1 < 100$. As the additive material $M_1$, at least one of materials is selected from PbO, $Sb_2O_3$, $Bi_2O_3$ or $TeO_2$, and as the reaction elements R, at least one of element is selected from Cr, Fe, W, Mn.

The major component of the starting material $GeO_2$ has a tetragonal crystalline structure whose melting temperature is 1086° C.

In the crucible 22 in FIG. 4, the mixture of $GeO_2$ powder, additive material $M_1$ powder and deoxidizing reaction elements R powder are heated by the heater 20. The temperature is selected in the range from 700° to 1200° C, according to the additive material.

Under these conditions, the mixture is melted, reacted, and sub-oxide vapor is deposited on the substrate.

The deposited film has one of the following compositions, according to the additive material.

Figure 5:
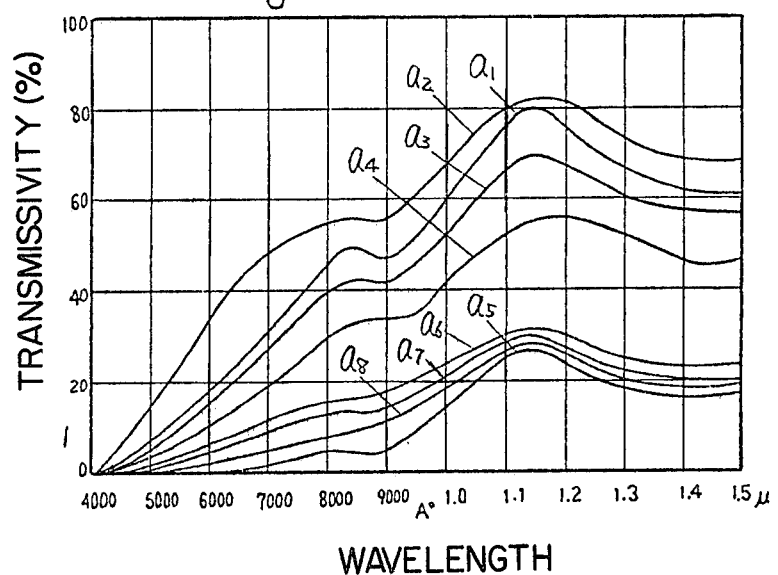
FIGS. 5 to 9 are graphs showing the relation between light transmissivity and wave length in the embodiments according to the present invention.

$(GeO_{x1})_{100-z}(PbO_{x4})_z$; $0 < x4 \leq 1.0$ $(GeO_{x1})_{100-z}(SbO_{x5})_z$; $0 < x5 \leq 1.5$ $(GeO_{x1})_{100-z}(BiO_{x5})_z$; $0 < x5 \leq 1.5$ $(GeO_{x1})_{100-z}(TeO_{x6})_z$; $0 < x6 \leq 2.0$ $0 < z < 100$ FIG. 5 shows the relation between the light transmissivity and wavelength for the storage device of these examples.

In this figure, line $a1$ to $a4$, are for the sample with nothing recorded thereon and line $a5$ to $a8$, are for the sample on which information is recorded.

As for the sample in which $TeO_2$ is used as an additive, the data is represented by the line $a1$ and $a5$; PbO, by the line $a2$ and $a6$; $Sb_2O_3$, the line $a3$ and $a7$ and $Bi_2O_3$, the line $a4$ and $a8$. These additives are added in the amount of 20 mole %.

This embodiment has the following advantages as compared with hitherto known amorphous materials in a non-oxidized system.

(1) As for the initial state in which nothing is recorded, the light transmissivity is about three times as great. This means that it has a higher contrast ratio, about three times that of the hitherto known materials because the optical density in the written state is not very different from hitherto known materials.

(2) The amount of the transmission change is about three times as great, because of the transmission of the initial state of this film is about three times as great compared with hitherto known materials.

(3) The mechanical strength is excellent because the adherence between the sub-oxide film and the substrate is greater.

(4) The optical properties are stable in air in room light.

EXAMPLE II $Sb_2O_3$ powder is used as a starting material. Starting material composition is represented by the following formula:

$$\{(Sb_2O_3)_{100-y2}(M_2)_{y2}\}_{100-z2} R_{z2}$$

$M_2$; additive material
R; deoxidizing reaction element
where y2 and z2 represent mole % and $0 < y2 < 100$, and $0 < z2 < 100$. As the additive material $M_2$, at least one of materials is selected from $TeO_2$, CuO, PbO, $B_2O_3$, and as the reaction elements R, at least one of elements is selected from Mn, W, Fe, Cr.

The major component of the starting material $Sb_2O_3$ has an orthorhombic crystalline structure whose melting temperature Tm is 656° C.

The mixture of $Sb_2O_3$ powder, additive material powder and the deoxidizing reaction element powder are heated up in the crucible 22 of FIG. 4. The temperature is selected in the range from 600° to 1000° C according to the additive material.

Under these conditions, the mixture is melted, reacted, and sub-oxide is deposited on the substrate.

The deposited film has one of the following compositions, according to the additive material.

$$(SbO_{x1})_{100-z}(PbO_{x4})_z; 0 < x4 \leq 1.0$$

$$(SbO_{x1})_{100-z}(TeO_{x6})_z; 0 < x6 \leq 2.0$$

$$(SbO_{x1})_{100-z}(CuO_{x7})_z; 0 < x7 \leq 1.0$$

$$(SbO_{x1})_{100-z}(BO_{x8})_z; 0 < x8 \leq 1.5$$

$$0 < z < 100$$

Figure 7:
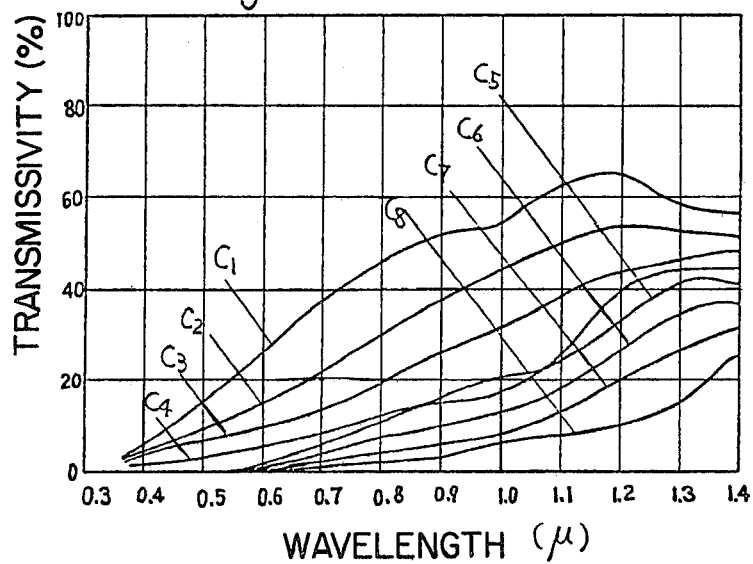

FIG. 7 shows the relation between the light transmissivity and wavelength for the storage device of these samples. In this figure, lines c1 to c4 are for the sample with nothing recorded thereon and lines c5 to c8 are for the sample on which information is recorded.

As for the sample in which $TeO_2$ is used as an additive, such data is represented by the lines c1 and c5; CuO, by the lines c2 and c6; PbO, by the lines c3 and c7 and $B_2O_3$ by the c4 and c8.

Figure 6:
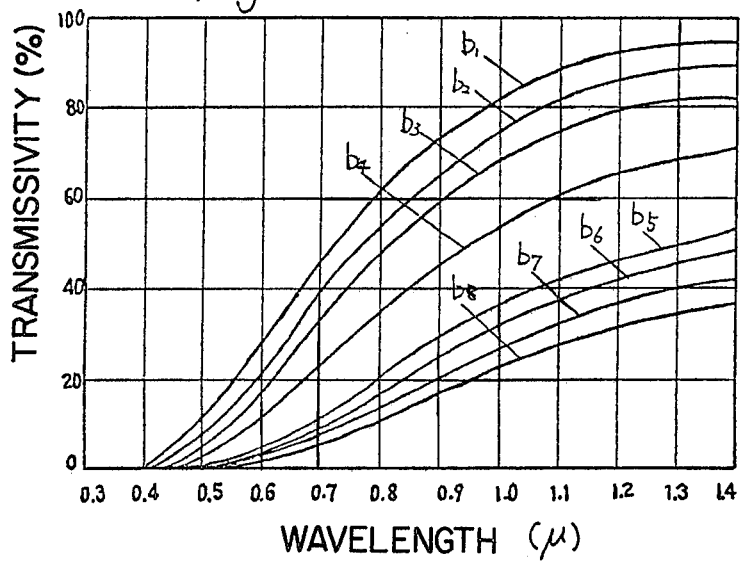

FIG. 6 shows the relation between the light transmissivity and wavelength for the samples with $SbO_{x1}$, without an additive. Lines b1 to b4 are for the sample with nothing recorded thereon and lines b5 to b8 are for the sample on which information is recorded. Besides, the lines b1 and b5 are for the sample obtained by using Mn as the reaction element. The lines b2 and b6 are for the case of W. The lines b3 and b7 are for the case of Fe. The lines b4 and b8 are for the case of Cr.

This embodiment has the following advantages as compared with hitherto known amorphous materials in a non-oxidized system.

(1) The sensitivity is about three times as great.

(2) As for the initial state in which nothing is recorded, the light transmissivity is about twice as great. This means that it has a higher contrast ratio, about twice as great that of the hitherto known material.

(3) The optical properties are stable in air in room light.

EXAMPLE III $MoO_3$ powder is used as a starting material.

The starting material composition is represented by the following formula:

$$\{(MoO_3)_{100} - y3^{(M_3)} y3\} 100 - z3 \; ^R z3$$

$M_3$; additive material
R; deoxidizing reaction element
where y3 and z3 represent mole % and $0 < y3 < 100$, and $0 < z3 < 100$. As the additive material $M_3$, at least one of materials is selected from PbO, $In_2O_3$, SnO, $B_2O_3$, $Bi_2O_3$, $TeO_2$.

As the reaction elements R, at least one of elements is selected from Cr, Fe, W, Mn.

The major component of the starting material $MoO_3$ has an orthohombic crystalline structure and whose vaporizing temperature is 795° C.

The mixture of $MoO_3$ powder, the additive material $M_3$ powder and the deoxidizing reaction element R powder are heated in the crucible 22 of FIG. 4. The temperature is selected in the range from 700° to 1000° C according to the additive material. Under these conditions, the mixture is melted, reacted, and sub-oxide vapor is deposited on the substrate.

The deposited film has one of the following compositions; according to the additive material.

$$(MoO_{x3})_{100-z}(SbO_{x4})_z; 0 < x4 \leq 1.0$$

$$(MoO_{x3})_{100-z}(BiO_{x5})_z; 0 < x5 \leq 1.5$$

$$(MoO_{x3})_{100-z}(TeO_{x6})_z; 0 < x6 \leq 2.0$$

$$(MoO_{x3})_{100-z}(BO_{x8})_z; 0 < x8 \leq 1.5$$

$$0 < z < 100$$

These films are pale blue and when energy is applied, for example light exposure, change to dark blue and can store optical information.

Figure 9:
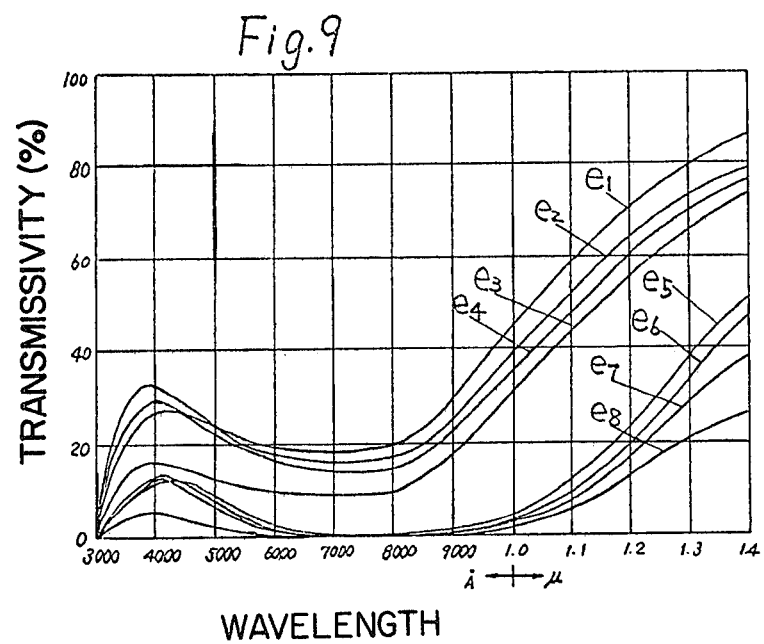

FIG. 9 shows the relation between the light transmissivity and wavelength for the storage device of this example. In this figure, lines e1 to e4 are for the sample with nothing recorded thereon, and lines e5 to e8 are for the sample on which information is recorded.

As for the sample in which $TeO_2$ is used as an additive, the such data is represented by the lines e1 and e5; $B_2O_3$, by the lines e2 and e6; $Sb_2O_3$, by the lines e3 and e7 and $Bi_2O_3$, by the lines e4 and e8.

Figure 8:
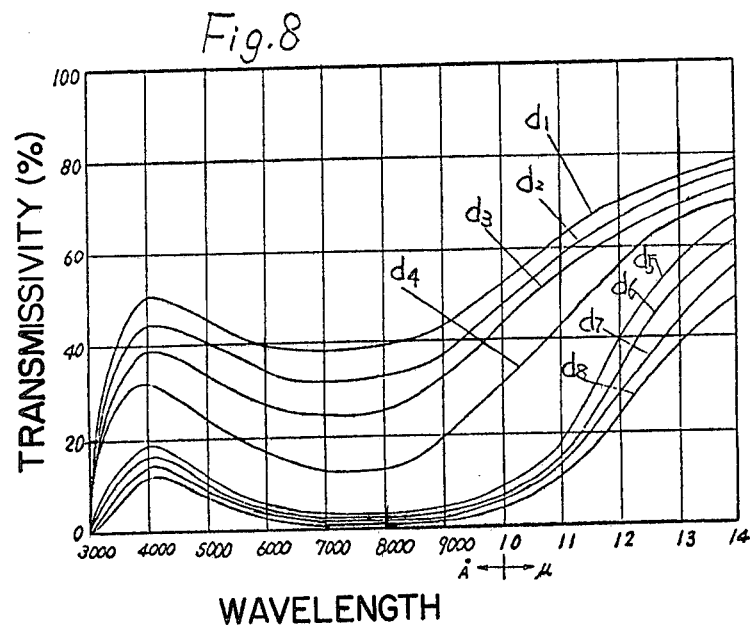

FIG. 8 shows the relation between the light transmissivity and the wavelength for the samples of $MoO_{x3}$, without an additive. Lines d1 to d4 are for the sample with nothing recorded thereon and lines b5 to b8 are for the sample on which information is recorded. Besides, the lines d1 and d5 are for the sample obtained by using Cr as the reaction element. The lines d2 and d6 are for the case of Fe. The lines d3 and d7 are for the case of W. The lines d4 and d8 are for the case of Mn.

This embodiment has the following advantage as compared with hitherto known amorphous materials in a non-oxided system.

(1) Large optical density change can be obtained, because in the initial state in which nothing is recorded, light transmission is about twice as great and the optical density in the written state is not very different from hitherto known material.

(2) Infrared light, for example, with the wavelength of 8000 A, which is obtained by laser diodes can be applied for recording or retrieving an optical information, because in this range of wavelength, $MoO_{x3}$ suboxide film has a relatively large optical absorption coefficient.

EXAMPLE IV

Using the same method stated in Example I or II, other oxide materials such as $SnO_2$, $Tl_2O_3$, $Bi_2O_3$ can be used as starting materials.

In the case of $SnO_2$, it has a tetragonal crystalline structure whose melting temperature $Tm$ is 1127° C.

The starting material compositions are represented by the following formula:

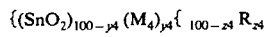

$M_4$; additive material
$R$; deoxidizing reaction element where $y4$ and $z4$ show mole % and $0 < y4 < 100$ and $0 < z4 < 100$ and for the additive material $M_4$, at least one of materials selected from $TeO_2$, $PbO$, $Bi_2O_3$. $Sb_2O_3$.

As reaction elements R, at least one of elements selected from Mn, W, Fe, Cr are employed.

Vapor deposition of these material can be carried out by the same method as for the case of $GeO_2$.

The deposited film is pale yellow and the transmissivity of visible light is within 60 and 80%, and when optical or thermal energy is applied, the transmission coefficient can be reduced to 10% and the exposed portion becomes black colored.

In the case of $Tl_2O_3$, it has a hexagonal crystalline structure whose melting temperature $Tm$ is 715° C.

The starting material compositions is represented by the following formula:

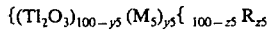

$M_5$; additive material
$R$; deoxidizing reaction element where $x, y$ represent mole % and $0 < y5 < 100$ and $0 < z5 < 100$ and for the additive material $M_5$, at least one of materials selected from $TeO_2$, $B_2O_3$, $GeO_2$, $Sb_2O_3$ is employed. For reaction elements R, at least one of elements selected from Mn, W, Fe, Cr.

Vapor deposition of these material can be carried out with the same method as for the case $Sb_2O_3$. The deposited sub-oxide film obtained is pale brown and the transmissity increases from 40 to 80% when the light wavelength increases from 6000 A to 1.2μ.

The film of these materials has a high sensitivity characteristic. Under the short exposure (<1 sec) of projector lamp, the film becomes darker, so that it can be used as high sensitivity optical information storage material. In the case of $Bi_2O_3$, which has orthorhombic crystalline structure and whose melting temperature is 820° C, a sub-oxide film is obtained by the same process given in Example II.

The deposited film is pale gray and the transmission coefficient is nearly constant in the wavelength range 4000 to 7000 A, and exhibits a relatively large reflectivity change when optical or thermal energy is applied.

What is claimed is:

1. In an optical information storage material having a substrate and a film deposited on said substrate, the state of which can be changed between the low optical density state and the high optical density state by the application of electrical, optical, or thermal energy, the improvement wherein said film comprises at least one sub-oxide composition selected from the group consisting of $GeO_{x1}$, $SnO_{x1}$, $SbO_{x2}$, $TlO_{x2}$, $BiO_{x2}$ and $MoO_{x3}$, wherein $0 < x1 < 2.0$, $0 < x2 < 1.5$, and $0 < x3 < 3.0$.

2. In a material as claimed in claim 1, the improvement wherein the sub-oxide film comprises a sub-oxide selected from the group consisting of $GeO_{x1}$ and $SnO_{x1}$ as a major component and further comprises at least one oxide selected from the group consisting of $PbO_{x4}$, $SbO_{x5}$, $BiO_{x5}$ and $TeO_{x6}$ as an additive for increasing the sensitivity of the film, wherein $0 < x4 \leq 1.0$, $0 < x5 \leq 1.5$ and $0 < x6 \leq 2.0$.

3. In a material as claimed in claim 1, the improvement wherein said sub-oxide film comprises $SbO_{x2}$ as a major component, and further comprises at least one oxide selected from the group consisting of $PbO_{x4}$, $TeO_{x6}$, $CuO_{x7}$ and $BO_{x8}$ as an additive for increasing the sensitivity of the film, wherein $0 < x4 \leq 1$, $0 < x6 \leq 2$, $0 < x7 \leq 1$ and $0 < x8 \leq 1.5$.

4. In a material as claimed in claim 1, the improvement wherein sub-oxide film comprises $TlO_{x2}$ as a major component, and further comprises at least one oxide selected from the group consisting of $TeO_{x6}$, $SnO_{x9}$, and $GeO_{x10}$ as an additive for increasing the sensitivity of the film, wherein $0 < x6 \leq 2$, $0 < x9 \leq 2$, and $0 < x10 \leq 2$.

5. In a material as claimed in claim 1, the improvement wherein said sub-oxide film comprises $MoO_{x3}$ as a major component, and further comprises at least one oxide selected from the group consisting of $PbO_{x4}$, $SbO_{x5}$, $BiO_{x5}$, $TeO_{x6}$, $BO_{x8}$, $SnO_{x9}$ and $InO_{x12}$, as an additive for increasing the sensitivity, wherein $0 < x4 \leq 1.0$, $0 < x5 \leq 1.5$, $0 < x6 \leq 2.0$, $0 < x8 \leq 1.5$, $0 < x9 \leq 2.0$ and $0 < x12 \leq 1.5$.

6. An optical information storage material comprising a transparent substrate and a film deposited on said substrate, the state of which film can be changed between the low transmissivity state and the high transmissivity state by the application of electrical, optical or thermal energy, said film comprising at least one sub-oxide composition selected from the group of $GeO_{x1}$, $SnO_{x1}$, $SbO_{x2}$, $TlO_{x2}$, $BiO_{x2}$ and $MoO_{x3}$, wherein $0 < x1 < 2.0$, $0 < x2 < 1.5$ and $0 < x3 < 3.0$.

7. An optical information storage material comprising an opaque substrate and a film deposited on said substrate, the state of which film can be changed between the state of low reflectivity and the state of high reflectivity by the application of electrical, optical or thermal energy, said film comprising at least one sub-oxide composition selected from the group consisting of $GeO_{x1}$, $SnO_{x1}$, $SbO_{x2}$, $TlO_{x2}$, $BiO_{x2}$, and $MoO_{x3}$, wherein $0 < 1 < 2.0$, $0 < x2 < 1.5$ and $0 < x3 < 3.0$.

8. A method of making an optical information storage material having a substrate and a sub-oxide film deposited on said substrate which is comprised of a composition selected from the group consisting of $GeO_{x1}$, $SnO_{x1}$, $SbO_{x2}$, $TlO_{x2}$, $BiO_{x2}$ and $MoO_{x3}$ wherein $0 < x1 < 2.0$, $0 < x2 < 1.5$ and $0 < x3 < 3.0$, which comprises evaporating an oxide selected from the group consisting of $GeO_2$, $SnO_2$, $Sb_2O_3$, $Tl_2O_3$, $Bi_2O_3$ and $MoO_3$ under deoxidizing conditions and depositing the vapor on the substrate.

9. A method as claimed in claim 8 in which the step of evaporating under deoxidizing conditions comprises heating said oxides with reaction elements in vacuum and evaporating them at a vacuum on the order of $5 \times 10^{-5}$ mmHg.

10. A method of making an optical information storage material having a substrate and a film deposited on said substrate, the state of which film can be changed between the low optical density state and the high optical density state by the application of electrical, optical or thermal energy, comprising the steps of:

preparing a solid solution selected from the group consisting of a major proportion of $GeO_2$ or $SnO_2$ and a minor proportion of $PbO$, $Sb_2O_3$, $Bi_2O_3$ or $TeO_2$, a major proportion of $Sb_2O_3$ and a minor proportion of $PbO$, $TeO_2$, $CuO$ or $B_2O_3$, a major proportion of $Tl_2O_3$ and a minor proportion of $TeO_2$, $SnO_2$ or $GeO_2$, or a major proportion of $MoO_3$ and a minor proportion of $PbO$, $Sb_2O_3$, $Bi_2O_3$, $TeO_2$, $B_2O_3$, $SnO_2$ or $In_2O_3$; and evaporating the solid solution under deoxidizing conditions and depositing the vapor on the substrate.

11. A method as claimed in claim 10, in which the step of preparing the solid solution comprises mixing the major component and the additive oxide both in powdered form, heating the mixture of powders to the melting temperature thereof and holding the melted mixture at the melting temperature from 3 to 4 hours, and quenching the melted mixture.

* * * * *